US011575450B2

(12) United States Patent
Verma et al.

(10) Patent No.: US 11,575,450 B2
(45) Date of Patent: Feb. 7, 2023

(54) SELF-RADIATED LOOPBACK TEST PROCEDURE FOR MILLIMETER WAVE ANTENNAS

(71) Applicant: QUALCOMM Incorporated, San Diego, CA (US)

(72) Inventors: Gaurav Verma, San Diego, CA (US); David Collins, Del Mar, CA (US); Ryan Wendlandt, San Diego, CA (US); Prachi Deshpande, San Diego, CA (US); Gaurav Singhania, San Diego, CA (US); Karthik Moncombu Ramakrishnan, Chennai (IN); Jeffrey Carr, San Diego, CA (US); Anushruti Bhattacharya, San Diego, CA (US); Dennis Feenaghty, Solana Beach, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/663,298

(22) Filed: Oct. 24, 2019

(65) Prior Publication Data

US 2020/0136732 A1 Apr. 30, 2020

Related U.S. Application Data

(60) Provisional application No. 62/751,525, filed on Oct. 26, 2018.

(51) Int. Cl.
*H04B 17/14* (2015.01)
*H04B 1/00* (2006.01)
(Continued)

(52) U.S. Cl.
CPC ............ *H04B 17/14* (2015.01); *H01Q 3/267* (2013.01); *H04B 1/0064* (2013.01); *H04B 1/50* (2013.01); *H04B 17/19* (2015.01)

(58) Field of Classification Search
CPC ...... H01Q 3/267; H01Q 21/08; H01Q 9/0407; H01Q 9/265; H04B 17/14; H04B 17/19;
(Continued)

(56) References Cited

U.S. PATENT DOCUMENTS 10,466,772 B2* 11/2019 Trotta ................. B60R 16/037
2006/0253812 A1* 11/2006 Hildebrant ....... G01R 31/31727
716/136

(Continued)

FOREIGN PATENT DOCUMENTS

| CN | 101183900 A | 5/2008 |
|---|---|---|
| CN | 102571483 A | 7/2012 |
| JP | 6259879 B1 | 1/2018 |

OTHER PUBLICATIONS

International Search Report and Written Opinion—PCT/US2019/058102—ISA/EPO—dated Feb. 10, 2020.

*Primary Examiner* — April G Gonzales
(74) *Attorney, Agent, or Firm* — Qualcomm Incorporated

(57) ABSTRACT

Methods and systems for automated testing of extremely-high frequency devices are disclosed. A device under test (DUT) is set in a simultaneous transmit and receive mode. The DUT receives a lower frequency radio frequency (RF) signal from a test unit and up-converts the lower frequency RF signal to a higher frequency RF signal. The DUT transmits the higher frequency RF signal using a first antenna, and receives the higher frequency RF signal using a second antenna. The DUT down-converts the received higher frequency RF signal to a received test RF signal and provides the received test RF signal to the test unit for
(Continued)

comparing measurements derived from the received test signal to a design specification for the DUT.

20 Claims, 8 Drawing Sheets

(51) Int. Cl.
*H01Q 3/26* (2006.01)
*H04B 17/19* (2015.01)
*H04B 1/50* (2006.01)

(58) Field of Classification Search
CPC .... H04B 1/0064; H04B 1/50; H04B 17/0085; H04B 17/102; H04B 17/17; H04B 17/29; G01R 31/2822; G01R 31/2856; G01R 31/311
USPC ...................................................... 455/67.14
See application file for complete search history.

(56) References Cited

U.S. PATENT DOCUMENTS

| | | | |
|---|---|---|---|
| 2009/0153158 A1* | 6/2009 | Dunn | G01R 31/2822 324/762.01 |
| 2016/0308626 A1* | 10/2016 | Mow | H04B 17/14 |
| 2017/0195072 A1* | 7/2017 | Lomnitz | H04B 1/1018 |
| 2018/0034559 A1* | 2/2018 | Foegelle | H04W 72/042 |
| 2018/0034560 A1* | 2/2018 | Foegelle | H04B 17/0085 |
| 2018/0034561 A1* | 2/2018 | Foegelle | H04B 17/0087 |
| 2018/0034562 A1* | 2/2018 | Foegelle | H04B 17/0085 |
| 2018/0034563 A1* | 2/2018 | Foegelle | H04B 17/364 |
| 2018/0048398 A1* | 2/2018 | El-Hassan | H01Q 3/36 |
| 2019/0064236 A1* | 2/2019 | Verspecht | G01R 27/28 |
| 2019/0238240 A1* | 8/2019 | Lin | H04J 4/00 |
| 2019/0242973 A1* | 8/2019 | Schat | G01S 7/4021 |
| 2019/0302184 A1* | 10/2019 | Rowell | G01R 29/0821 |
| 2020/0067613 A1* | 2/2020 | Reynolds | H04B 17/345 |
| 2020/0136732 A1* | 4/2020 | Verma | H04B 17/17 |

* cited by examiner

SELF-RADIATED LOOPBACK TESTING

SELF-RADIATED LOOPBACK TESTING

SELF-RADIATED LOOPBACK TEST PROCEDURE FOR MILLIMETER WAVE ANTENNAS

CROSS-REFERENCE TO RELATED APPLICATIONS

The present Applications for patent claims the benefit of U.S. Provisional Application No. 62/751,525, entitled "SELF-RADIATED LOOPBACK TEST PROCEDURE FOR MILLIMETER WAVE ANTENNAS," filed Oct. 26, 2018, assigned to the assignee hereof, and expressly incorporated herein by reference in its entirety.

TECHNICAL FIELD

Various aspects described herein generally relate to wireless communication systems, and more particularly, to testing of devices having or using millimeter wave (mmW) antennas.

BACKGROUND

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., Long Term Evolution (LTE) or WiMax). There are presently many different types of wireless communication systems in use, including Cellular and Personal Communications Service (PCS) systems. Examples of known cellular systems include the cellular Analog Advanced Mobile Phone System (AMPS), and digital cellular systems based on code division multiple access (CDMA), frequency division multiple access (FDMA), time division multiple access (TDMA), the Global System for Mobile access (GSM) variation of TDMA, etc.

A fifth generation (5G) mobile standard, referred to as New Radio (NR), calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, with 1 gigabit per second to tens of workers on an office floor. Several hundreds of thousands of simultaneous connections should be supported in order to support large sensor deployments. Consequently, the spectral efficiency of 5G mobile communications should be significantly enhanced compared to the current 4G standard. Furthermore, signaling efficiencies should be enhanced and latency should be substantially reduced compared to current standards.

Some wireless communication networks, such as 5G, support operation at very high and even extremely-high frequency (EHF) bands, such as millimeter wave (mmW) frequency bands (generally, wavelengths of 1 mm to 10 mm, or 10 to 300 GHz). These extremely-high frequencies may support very high throughput such as up to six gigabits per second (Gbps). One of the challenges for wireless communication at very high or extremely-high frequencies, however, is that a significant propagation loss may occur due to the high frequency. As the frequency increases, the wavelength may decrease, and the propagation loss may increase as well. At mmW frequency bands, the propagation loss may be severe. For example, the propagation loss may be on the order of 22 to 27 dB, relative to that observed in either the 2.4 GHz, or 5 GHz bands.

Transmitting at these extremely-high frequencies places high demands on the antenna designs and also on testing these devices to ensure that the transmission and receiving circuitry is operating correctly. The characterization and high volume manufacturing for mmW patch and dipole antenna modules is extremely challenging. Test solutions are often bulky as well as expensive due complex equipment and setup traditionally needed for testing, such as anechoic chambers for antenna testing. Common challenges include module calibration and multi-site production on expensive automatic testing equipment (ATE) to support mmW frequencies. Drawbacks of conventional testing systems include longer test times and large physical size of test systems, thereby requiring large floor areas in production environments. It is therefore desired to have a viable and cost effective solution for testing mmW devices in high volumes.

SUMMARY

Various aspects disclosed herein are directed to methods and devices for testing of devices having or using millimeter wave (mmW) or extremely-high frequency antennas. The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below In an aspect, a method of testing a device under test (DUT) performed by the DUT includes setting the DUT in a simultaneous transmit and receive mode; receiving a lower frequency radio frequency (RF) signal from a test unit; up-converting the lower frequency RF signal to a higher frequency RF signal; transmitting the higher frequency RF signal using a first antenna of the DUT; receiving the higher frequency RF signal using a second antenna of the DUT; down-converting the received higher frequency RF signal to a received test RF signal; and providing the received test RF signal to the test unit.

In an aspect, a method of testing a DUT performed by a test unit includes configuring the DUT to set a simultaneous transmit and receive mode; generating a lower frequency RF signal, the test unit comprising only lower frequency RF components; providing the lower frequency RF signal to the DUT; receiving a received test RF signal from the DUT; and comparing measurements derived from the received test RF signal to a design specification for the DUT.

In an aspect, a DUT includes a memory; at least one processor coupled to the memory; and a plurality of antennas coupled to the at least one processor, wherein the at least one processor is configured to set the DUT in a simultaneous transmit and receive mode; wherein at least one of the plurality of antennas is configured to receive a lower frequency RF signal from a test unit; wherein the at least one processor is configured to up-convert the lower frequency RF signal to a higher frequency RF signal; wherein a first antenna of the plurality of antennas is configured to transmit the higher frequency RF signal; wherein a second antenna of the plurality of antennas is configured to receive the higher frequency RF signal using a second antenna of the DUT; wherein the at least one processor is configured to down-convert the received higher frequency RF signal to a received test RF signal; and wherein the at least one processor is configured to provide the received test RF signal to the test unit.

In an aspect, a device test system, including a test unit, includes a signal generator configured to generate a lower frequency RF signal and to provide the lower frequency RF signal to a DUT, the test unit comprising only lower frequency RF components; a signal analyzer configured to receive a received test RF signal from the DUT and to compare measurements from the received test RF signal to a design specification for the DUT; and a fixture for mounting the DUT to the test unit.

In an aspect, an apparatus for testing a DUT includes means of the DUT for setting the DUT in a simultaneous transmit and receive mode; means of the DUT for receiving a lower frequency RF signal from a test unit; means of the DUT for up-converting the lower frequency RF signal to a higher frequency RF signal; means of the DUT for transmitting the higher frequency RF signal using a first antenna of the DUT; means of the DUT for receiving the higher frequency RF signal using a second antenna of the DUT; means of the DUT for down-converting the received higher frequency RF signal to a received test RF signal; and means of the DUT for providing the received test RF signal to the test unit.

In an aspect, an apparatus for testing a DUT includes means of a test unit for configuring the DUT to set a simultaneous transmit and receive mode; means of the test unit for generating a lower frequency RF signal, the test unit comprising only lower frequency RF components; means of the test unit for providing the lower frequency RF signal to the DUT; means of the test unit for receiving a received test RF signal from the DUT; and means of the test unit for comparing measurements derived from the received test RF signal to a design specification for the DUT.

In an aspect, a non-transitory computer-readable medium storing computer-executable instructions includes computer-executable instructions comprising at least one instruction instructing a DUT to set the DUT in a simultaneous transmit and receive mode; at least one instruction instructing the DUT to receive a lower frequency RF signal from a test unit; at least one instruction instructing the DUT to up-convert the lower frequency RF signal to a higher frequency RF signal; at least one instruction instructing the DUT to transmit the higher frequency RF signal using a first antenna of the DUT; at least one instruction instructing the DUT to receive the higher frequency RF signal using a second antenna of the DUT; at least one instruction instructing the DUT to down-convert the received higher frequency RF signal to a received test RF signal; and at least one instruction instructing the DUT to provide the received test RF signal to the test unit.

In an aspect, a non-transitory computer-readable medium storing computer-executable instructions includes computer-executable instructions comprising at least one instruction instructing a test unit to configure the DUT to set a simultaneous transmit and receive mode; at least one instruction instructing the test unit to generate a lower frequency RF signal, the test unit comprising only lower frequency RF components; at least one instruction instructing the test unit to provide the lower frequency RF signal to the DUT; at least one instruction instructing the test unit to receive a received test RF signal from the DUT; and at least one instruction instructing the test unit to compare measurements derived from the received test RF signal to a design specification for the DUT.

Other objects and advantages associated with the aspects disclosed herein will be apparent to those skilled in the art based on the accompanying drawings and detailed description.

BRIEF DESCRIPTION OF THE DRAWINGS

A more complete appreciation of the various aspects described herein and many attendant advantages thereof will be readily obtained as the same becomes better understood by reference to the following detailed description when considered in connection with the accompanying drawings which are presented solely for illustration and not limitation, and in which.

DETAILED DESCRIPTION

Figure 1:
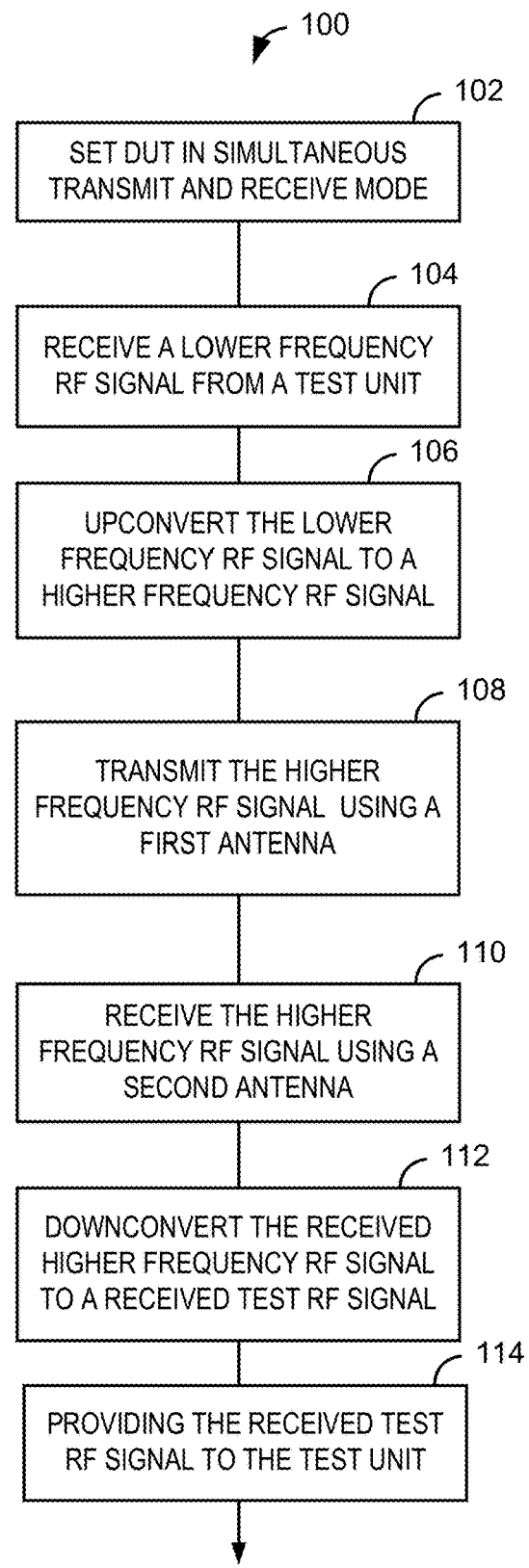
FIG. 1 illustrates an exemplary process of testing devices having or using mmW or EHF antennas according to various aspects of the disclosure.

Various aspects described herein generally relate to testing of devices having mmW and/or EHF antennas. Some ATE systems are focused on testing multiple antenna devices or modules including patch and dipole antennas. Included in the various aspects disclosed herein are self-radiated loopback methods and devices that can use patch and dipole antennas on the DUT (or coupled to the DUT for testing purposes) for performing transmit and receive tests. For example, the self-radiated loopback methods and devices allow for transmissions from one patch or dipole antenna to be measured on another of the patch or dipole antennas via near-field coupling. The self-radiated loopback test methods and devices (e.g., test units) can be used for mmW frequencies. According to the various aspects disclosed, the DUT is self-contained for mmW measurements and no external mmW equipment is used for the measurements. The various aspects disclosed herein allow for very low cost test solutions, which dramatically improves the area under the curve (AUC) of the modules being tested/DUTs. Additionally, the various aspects disclosed herein allow for a robust and reliable test platform that can improve time to market for the tested modules and devices that use these modules. Further, the various aspects disclosed herein allow for calibration and testing of the modules (e.g., phaser/antenna modules) inside end devices (e.g., UEs, mobile phones, etc.).

For example, for lower frequency components (e.g., antennas configured for sub-20 GHz operation), the substrates to which the antennas are attached can be a printed circuit board (PCB). However, for mmW-capable antennas, substrates with lower loss at mmW frequencies should be used. In addition, the cables, connectors, etc. used for mmW testing are typically much larger in size and/or more expensive than the cables, connectors, etc. used for lower frequency testing. Further, the socket/interface can be cheaper for lower frequency testing than for mmW testing. Additionally, mmW parasitics are much higher, and thus, the test equipment has to mitigate for such parasitics, which adds to the cost of the components.

These and other aspects are disclosed in the following description and related drawings to show specific examples relating to exemplary aspects. Alternate aspects will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects disclosed herein.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage, or mode of operation.

The terminology used herein describes particular aspects only and should not be construed to limit any aspects disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices that can communicate with a core network via a radio access network (RAN) and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on.

As noted above, the various aspects described herein generally relate to testing of devices or modules that include mmW and/or EHF antennas. These antennas can be used in devices used in high data rate communication systems, such as 4G and 5G wireless communication systems, and in particular, can be used in wireless communication systems with beam forming and multi-beam transmission and reception.

FIG. 1 illustrates an exemplary process 100 of testing devices having or using mmW or EHF antennas. The process 100 begins with the DUT being set in a simultaneous transmit and receive mode, at 102. At 104, a lower frequency RF signal can be received from a test unit. The test signal can be generated by a signal generator in the test unit. Further, the test signal test can be an intermediate frequency (IF) signal (i.e., sub-mmW) for testing the antennas. At 106, the DUT can up-convert the lower frequency RF signal to a higher frequency RF signal. At 108, the DUT can transmit the higher frequency RF signal over the air using a first antenna of the DUT.

It is understood that RF signals (e.g., the lower and higher frequency RF signals described above) can cover a broad range of frequencies (as will be described further below) and, as such, in the context of a mmW radiated signal, an IF signal could also have a frequency considered to be an RF signal. In an aspect, the lower frequency RF signal may be a continuous wave RF signal, or a modulated and/or a multi-tone lower frequency test signal. For example, the IF signal (i.e., the lower frequency RF signal) could have a frequency within the single-digit GHz range, for example, 8-9 GHz. In such an implementation, in one example, the antenna module of the DUT could be configured to up-convert the 8-9 GHz IF signal to, for example, a 38-39 GHz mmW signal (i.e., the higher frequency RF signal) by mixing the IF signal with, for example, a 30 GHz mmW local oscillator.

At 110, the higher frequency RF signal is received at the DUT using a second antenna. At 112, the higher frequency RF signal received at the second antenna can be down-converted, and at 114, the down-converted test signal can be provided to the test unit for evaluation and comparison to design specifications for the DUT.

It will be appreciated that according to the various aspects disclosed, many other additions and/or modifications can be made to the process 100 discussed above. For example, the DUT can transmit on a first layer (e.g., multiple-input and multiple-output (MIMO) layer 1) and receive on a second layer (e.g., MIMO layer 2). In some aspects, the first antenna and the second antenna can be selected from a plurality of antennas, if the DUT includes more than two antennas. The plurality of antennas may be integrated into the DUT. The plurality of antennas can be formed on a common substrate within the DUT, or may be formed on two or more substrates of the DUT.

Alternatively, the plurality of antennas may be coupled to the DUT prior to testing. For example, an antenna module with a plurality of antennas may be attached to a DUT without integrated antennas, prior to performing the self-radiated loopback test methods disclosed herein.

If there are more than two antennas in the DUT, the first antenna and the second antenna may be separated by at least one other antenna of the plurality of antennas. Additionally, each of the plurality of antennas may include both a dipole antenna and a patch antenna. In that case, in some aspects, the dipole antennas may be independently tested together and likewise the patch antennas may be independently tested together. In some implementations, the patch antennas and dipole antennas can be considered independent antennas.

Regardless of the number antennas in the DUT, the transmitting (block 108) and receiving (block 110) may be performed by a single transceiver integrated circuit (IC) that is part of the DUT and coupled to the plurality of antennas. Further, it will be appreciate that the DUT may include other ICs and active and/or passive devices. For example, in some aspects, the DUT may include a power management IC. Accordingly, the discussion and representation of the DUT configurations provided herein are merely illustrative and are not an exhaustive detailing of the various DUT configurations contemplated to be within the scope of the disclosure.

Figure 2:
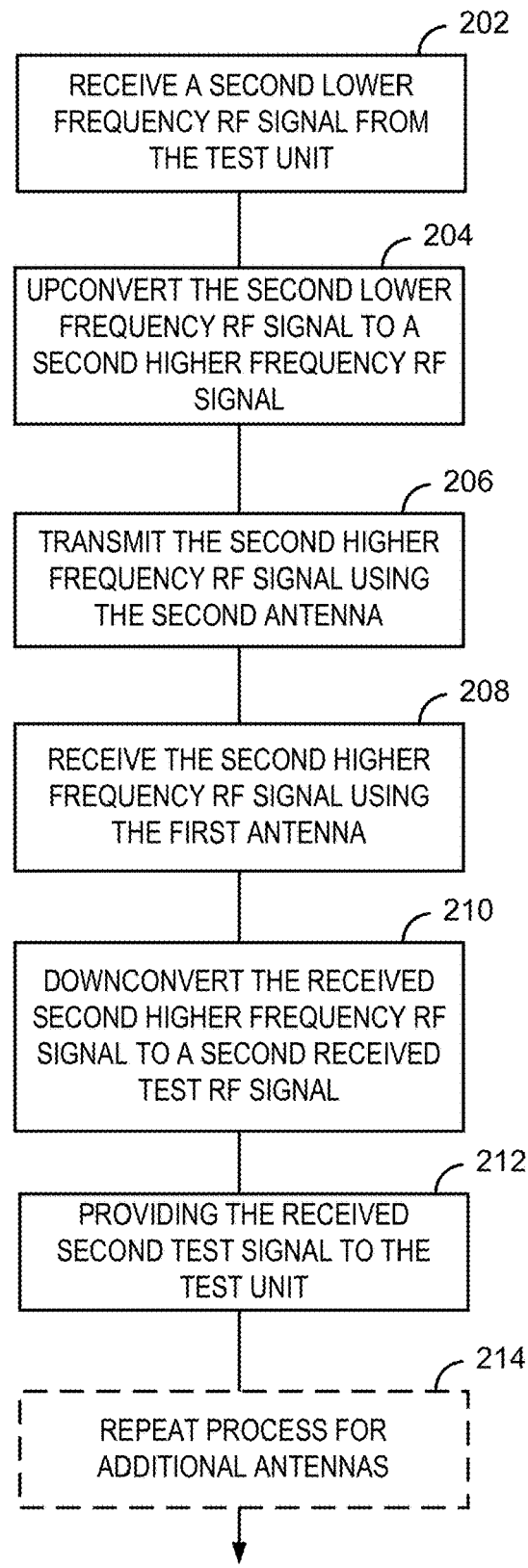
FIG. 2 illustrates further aspects of the exemplary process of testing devices having or using mmW or EHF antennas according to various aspects of the disclosure.

FIG. 2 illustrates further aspects of the exemplary process of testing devices having or using mmW or EHF antennas. As illustrated, the process can continue to check the transmit and receive functioning of each antenna. At 202, a second lower frequency RF signal is received from the test unit, which can be the same as the original signal discussed above. At 204, the DUT can up-convert the second lower frequency RF signal to a second higher frequency RF signal. At 206, the second higher frequency RF signal is transmitted from the DUT using the second antenna (previously used to receive). At 208, the second higher frequency RF signal is received at the DUT using the first antenna (previously used to transmit). At 210, the second higher frequency RF signal received at the first antenna can be down-converted to a second received test RF signal. At 212, the second received test RF signal can be provided to the test unit for evaluation and comparison to design specifications for the DUT. Accordingly, both antennas will have been tested for both transmitting and receiving. Optionally, at 214, the testing process can be repeated for additional antennas in the DUT, so all antennas in the DUT can be tested and characterized. Further, it will be appreciated that according to the various aspects disclosed that the additions and/or modifications discussed in relation to FIG. 1 may also apply to the process discussed in relation to FIG. 2.

Figure 3:
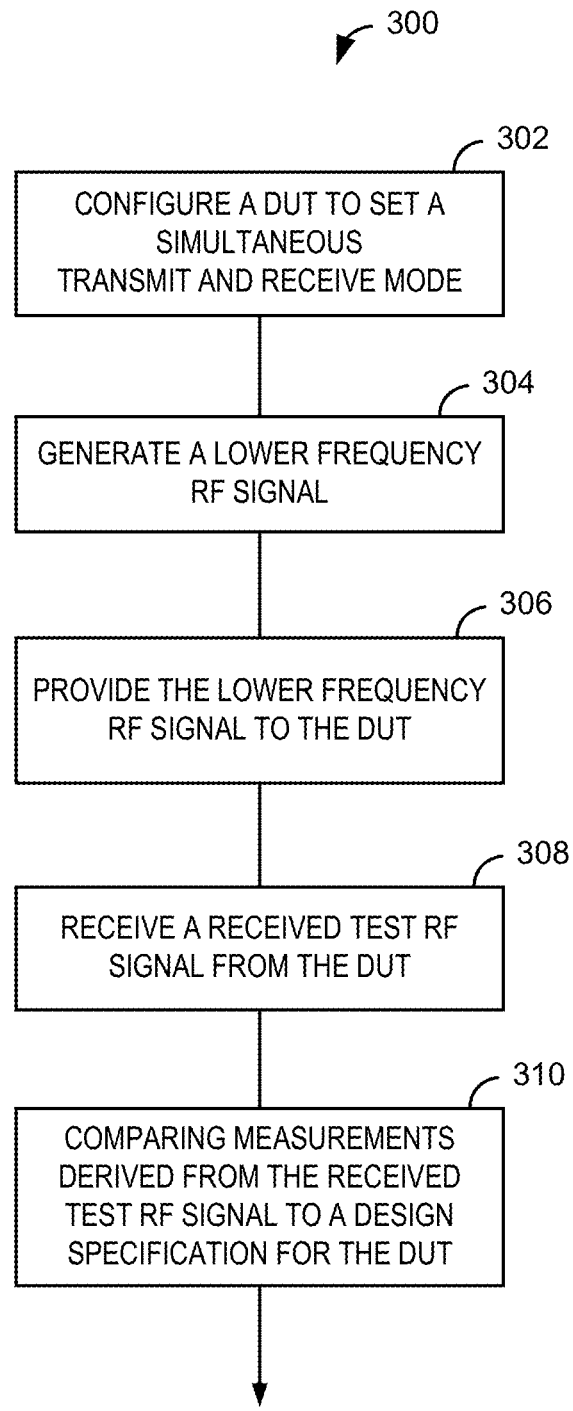
FIG. 3 illustrates further aspects of the exemplary testing process performed at a test unit according to various aspects of the disclosure.

FIG. 3 illustrates an exemplary testing process 300 performed at the test unit. At 302, the test unit configures the DUT to set a simultaneous transmit and receive mode. At 304, a lower frequency RF signal is generated at the test unit. At 306, the lower frequency RF signal is provide to the DUT. After the DUT performs operations 104 to 110 of FIG. 1, at 308, a received test RF signal is received from the DUT. At 310, measurements derived from the received test RF signal are compared to a design specification for the DUT. Comparing the measurements can include the test unit calculating and comparing receiver gain and transmit power at the DUT to the design specification. As discussed above, the test signal can be an IF signal, which can be generated by a signal generator in the test unit. It will be appreciated that the self-radiated loopback testing process 300, from the test unit perspective, has related aspects to the processes discussed above with reference to FIGS. 1 and 2, so a detailed explanation of similar aspects will not be provided.

Figure 4:
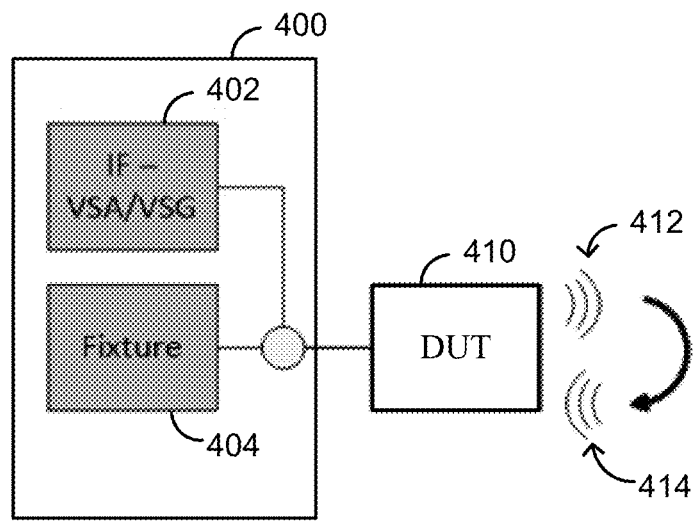
FIG. 4. illustrates an exemplary testing system according to various aspects of the disclosure.

FIG. 4 illustrates an exemplary testing system according to various aspects of the disclosure. In one example, a test system can include a test unit 400. The test unit 400 includes a signal generator 402 configured to generate a test signal (e.g., a lower frequency RF signal) and provide the test signal to a DUT 410, as described above with reference to, for example, blocks 304 and 306 of FIG. 3. In an aspect, the test unit 400 may include only lower frequency RF signal components, for example, RF signal components that that are only capable of processing frequencies less than 20 GHz.

The test unit 400 also includes a signal analyzer 402 configured to receive a signal that is a down-converted version of the test signal received from the DUT 410 and to compare measurements from the received signal to a design specification for the DUT 410, as described above with reference to, for example, block 308 and 310 of FIG. 3. A fixture 404 is also provided for mounting the DUT 410 to the test unit 400. It will be appreciated that the various functions of the test unit 400 attributed to elements listed above (e.g., signal generator and signal analyzer) may be performed by one or more processors in one device or multiple devices operably configured with appropriate code and coupled to various input and output devices (e.g., analog and/or digital inputs and outputs) to perform the various functions disclosed herein. Accordingly, it will be appreciated that the various aspects describe herein are not limited to the example illustrations.

The signal generator may be a vector signal generator (VSG). The signal analyzer may be a vector signal analysis/analyzer (VSA). In the illustration, the signal generator and signal analyzer are show as a common signal generator/analyzer device 402, as these functionalities may be integrated into a common device or may be separate devices, as is known in the art.

The IF signal generated by the signal generator/analyzer device 402 is up-converted at the DUT 410 to an RF signal, for example a mmW signal, and is transmitted 412 from the DUT 410, as discussed above with reference to blocks 106 and 108 of FIG. 1. Additionally, as discussed above with reference to blocks 110 to 114, the looped back RF signal, for example a mmW signal, is received 414 at the DUT 410 and is down-converted, and that down-converted received signal is provide to the signal generator/analyzer device 402.

As is known in the art, the signal generator can generate test signals including complex modulated signals related to various wireless standards, which are included in the modulated IF signal. The signal analyzer receives the complex modulated received signal as an input to the VSA. This received signal is digitized to obtain baseband signals. Various mathematical equations can be applied on this baseband signal to measure and plot various parameters. The test unit can derive measurements and parameters information, such as receiver gain, transmit power, error vector magnitude (EVM), adjacent channel leakage power ratio (ACLR), intermodulation distortion, and/or additional signal parameters that can be used to verify the DUT's 410 performance relative to the design specification for the DUT 410. These measurements, when compared to the design specification for the DUT 410, can be used to determine whether the DUT 410 is functioning properly. Additionally, errors, such as disabled/defective transmit and receive circuits, can be detected. The DUT 410 can be connected to the fixture 404 of the test unit 400 to aid in quick installation and testing of various DUTs. The fixture 404 can also include a socket for easy coupling of the DUT 410 connections to the test unit 400 for testing.

Additionally, as described above, in the test system, the DUT 410 is configured to operate in a simultaneous transmit and receive mode, to receive the test signal from the test unit 400, to transmit the test signal from the DUT 410 using a first antenna, to receive the test signal at the DUT 410 using a second antenna, and to provide the received test signal to the test unit 400. Additional testing aspects and functionalities of the DUT 410 and test unit 400, where discussed in the foregoing description of the various processes, will not be repeated herein for brevity.

Figure 5A:
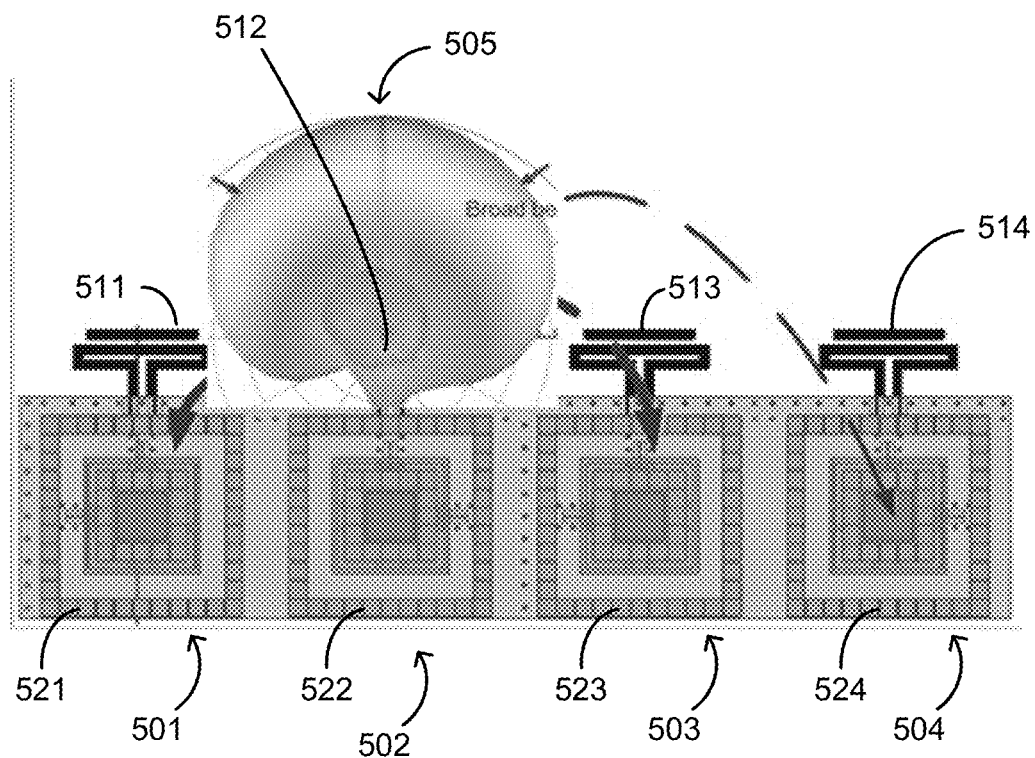
FIG. 5A illustrates a plurality of antennas of a module that can be used as a DUT according to various aspects of the disclosure.

FIG. 5A illustrates a plurality of antennas of a module that can be used as a DUT according to aspects of the disclosure. As illustrated, antenna 501, antenna 502, antenna 503, and antenna 504 are each formed on a common substrate. Antenna 501 includes both a dipole antenna 511 and a patch antenna 521. Antenna 502 includes both a dipole antenna 512 and a patch antenna 522. Antenna 503 includes both a dipole antenna 513 and a patch antenna 523. Antenna 504 includes both a dipole antenna 514 and a patch antenna 524. Each antenna as illustrated contains both a dipole and patch antenna, however, the various aspects disclosed are not limited to this configuration, as an antenna may have only one dipole antenna, one patch antenna, multiple dipole antennas, multiple patch antennas, or any combination thereof. Additionally or alternatively, the patch and dipole antennas can be considered each as independent antennas of the plurality of antennas of the module. In the illustrated example, antenna 502 is transmitting an RF signal illustrated as broad beam 505. Power from one patch antenna (521, 522, 523, or 524) or dipole antenna (e.g., 511, 512, 513, or 514) can be measure on nearby patches/dipoles. While some implementations may generally transmit from one patch antenna and receive on another patch antenna, or transmit from one dipole antenna and receive on another dipole antenna, it is understood that in other implementations, the test signal may be transmitted using one of the patch or dipole antenna while the test signal is received by the other of the patch or dipole antenna.

In one example, a patch antenna can support multiple mmW frequencies for transmission and reception, for example, a patch antenna could be configured to support both 28 GHz and 39 GHz measurements. Both 28 GHz and 39 GHz measurements at horizontal (H) and vertical (V) polarizations could, in such an example, be performed using antennas of the DUT itself. No external mmW equipment at the test unit is required for the test measurements. The thicker arrows represent that nearby patch antennas will receive more power than the far patch antennas. Although each of the adjacent antennas receives RF power from the transmission, antenna 504 is selected to receive the RF signal in this illustrated example. As discussed herein, according to one aspect, the transmitting antenna and receiving antenna of the antenna array can be separated by at least one antenna. In another example, the antenna of the antenna array transmitting a test signal and the antenna of the antenna array receiving the test signal are spaced apart a distance greater than the smallest distance between any two antennas in the array.

Figure 5B:
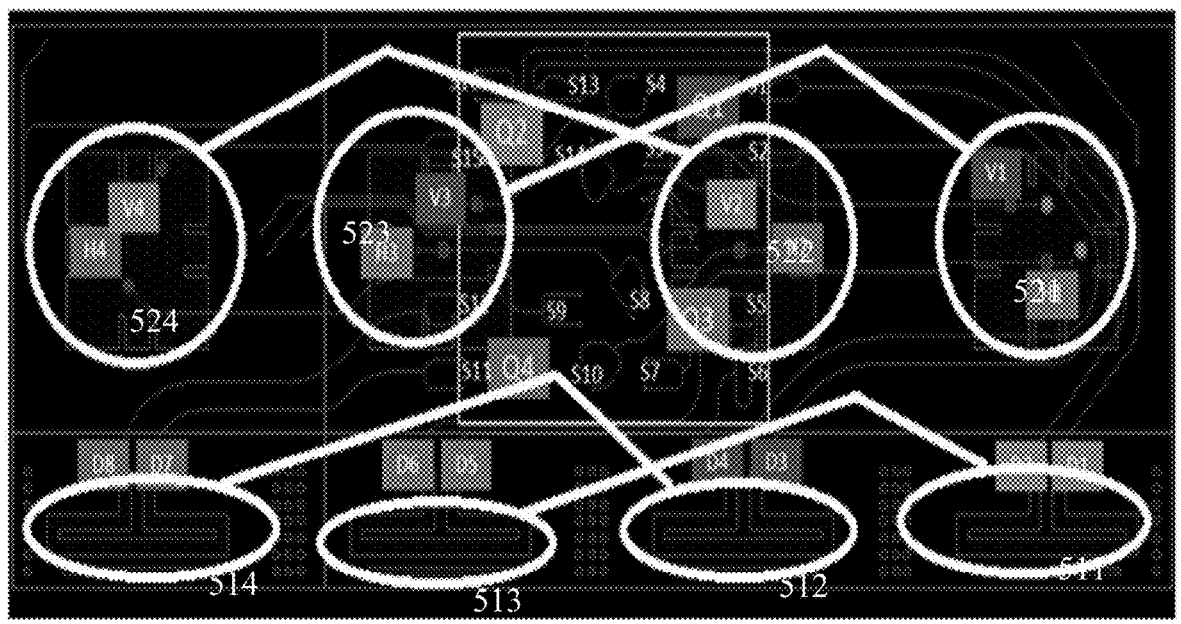
FIG. 5B illustrates the pairing of various antennas according to various aspects of the disclosure.

FIG. 5B illustrates the pairing of various antennas according to the various aspects disclosed. As noted above, power from one patch antenna (e.g., 521, 522, 523, or 524) or dipole antenna (e.g., 511, 512, 513, or 514) can be measured on nearby antennas during testing. In one example, the patch antennas 521 and 523 can be paired for testing as can patch antennas 522 and 524 be paired for testing. Likewise, dipole antennas 511 and 513 can be paired for testing as can dipole antennas 512 and 514 be paired for testing. Since the antenna pairs will be used in both the receive and transmit mode, all the patch and dipole antennas can be tested. In the illustrated example, each antenna pair can be tested individually, for example, a first patch antenna transmits and a second patch antenna to which it is paired for testing receives the transmission. The functions can thereafter be reversed and the second patch antenna transmits and the first patch antenna receives the transmission. However, the various aspects disclosed herein are not limited to these specific illustrations. Accordingly, various combinations of antennas may be used for testing based on the module design being tested and test parameter considerations.

As illustrated in FIG. 5B, patch antennas and/or dipole antennas may be connected to different MIMO layers when useful to allow for simultaneous transmission and reception, for example, in implementations where transmission and reception in a single layer share a common line, for example, an IF line. For example, patch antenna 521 is connected to traces H1 and V1, patch antenna 522 is connected to traces H2 and V2, patch antenna 523 is connected to traces H3 and V3, patch antenna 524 is connected to traces H4 and V4, dipole antenna 511 is connected to traces D1 and D2, dipole antenna 512 is connected to traces D3 and D4, dipole antenna 513 is connected to traces D5 and D6, and dipole antenna 514 is connected to traces D7 and D8. In the illustrated implementation, some of traces H1, H2, H3, H4, V1, V2, V3, and V4 are formed on one MIMO layer, for example a first MIMO layer (e.g., MIMO layer 1), while others of H1, H2, H3, H4, V1, V2, V3, and V4 are formed on another MIMO layer, for example a second MIMO layer (e.g., MIMO layer 2).

Also, in the illustrated example, each dipole antenna is illustrated as connected to two traces. For each dipole antenna, both traces are formed in the same MIMO layer, as the dipole antennas have differential inputs and/or outputs. Hence, in one such example, two of the dipole antennas illustrated each have two traces formed in one of the first or second MIMO layers and another two of the dipole antennas illustrated each have traces formed in another of the first or second MIMO layers. Hence, in implementations where the DUT transmits using a first MIMO layer and receives using a second MIMO layer, and where there are relatively few MIMO layers, for example two layers, transmit antenna and receive antenna pairs may be limited only to antenna pair combinations where one antenna can be driven using one of the two MIMO layers and the other antenna can receive using the other of the two MIMO layers. However, in alternative implementations, other hardware features can be used to enable the capability to transmit with one antenna while receiving with another antenna of the plurality of antennas.

Figure 5C:
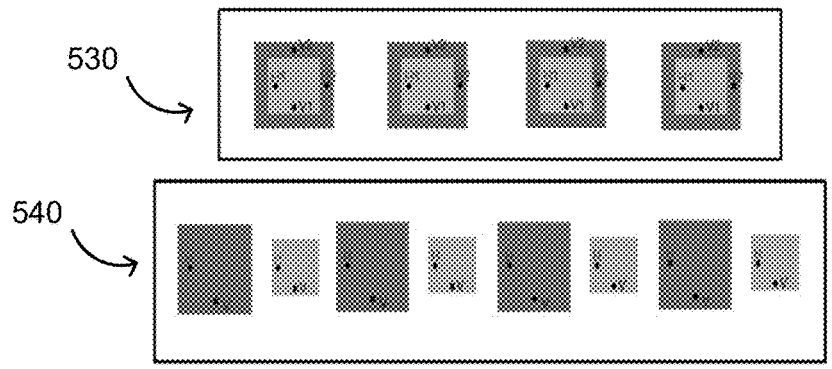
FIG. 5C illustrates various design options for antenna modules according to various aspects of the disclosure.

FIG. 5C illustrates various design options for antenna modules according to various aspects disclosed herein. As illustrated, in one configuration, an antenna module 530 can include a plurality of patch antennas. Each of the plurality of patch antennas can have two patch antennas tuned for two different frequencies (e.g., 28 GHz and 39 GHz). Each of the patch antennas may have horizontal (H) and vertical (V) polarizations. In the configuration of antenna module 530, the patch antennas tuned for the two different frequencies are overlapping. In the configuration of antenna module 540, the patch antennas tuned for the two different frequencies are adjacent. As noted above, it will be appreciated that the various aspects disclosed herein are not limited to these specific illustrations. Accordingly, various combinations of antenna configurations may be used based on the module design being tested, frequencies being used, and other test parameter considerations.

Figure 5D:
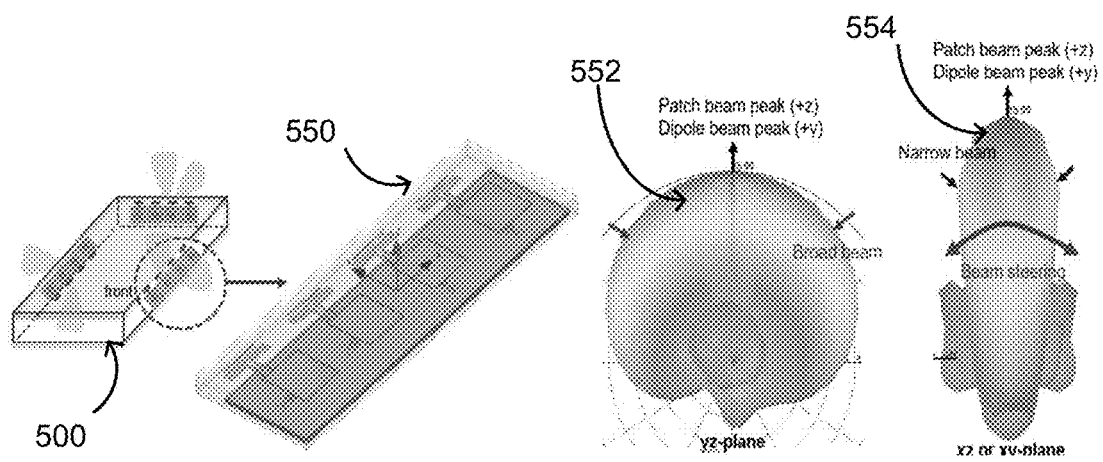
FIG. 5D illustrates a user equipment (UE) and an antenna module that can be used as DUTs according to various aspects of the disclosure.

FIG. 5D illustrates a UE 500 and associated antenna modules 550 that can be used as a DUT according to aspects of the disclosure. As illustrated, the UE 500 may contain multiple antenna modules 550 to provide for better spherical coverage of the transmitted beam(s) and received beam(s). Each antenna module 550 can contain a linear array of patch and dipole antennas as illustrated and discussed in the foregoing disclosure. The patch antennas may provide dual polarization, for example, in the y-z plane as illustrated by beam pattern 552. The dipole antenna may have a single polarization and provide a narrow beam in the x-z or x-y planes, as illustrated by beam pattern 554. Various module configurations and UE details will be provide in the following paragraphs.

Tailoring or optimizing the RF waveform for the low frequency test RF signal can be useful to enable testing of various aspects of the RF and/or mmW modules in the DUT, including, for example, the non-linearity transmit and receive performance, EVM, intermodulation distortion, receive linearity, power amplifier (PA) linearity, transmit signal path gain and linearity, mixer performance/design, port-to-port variation, antenna gain, antenna isolation, antenna coupling, and impedance mismatch between various components (such as testing for an impedance mismatch between the PA and antenna). The test unit should set the DUT into different gain modes to fine tune the transmit gain mode and the receive gain mode, and fine tune the antenna combinations.

Figure 6:
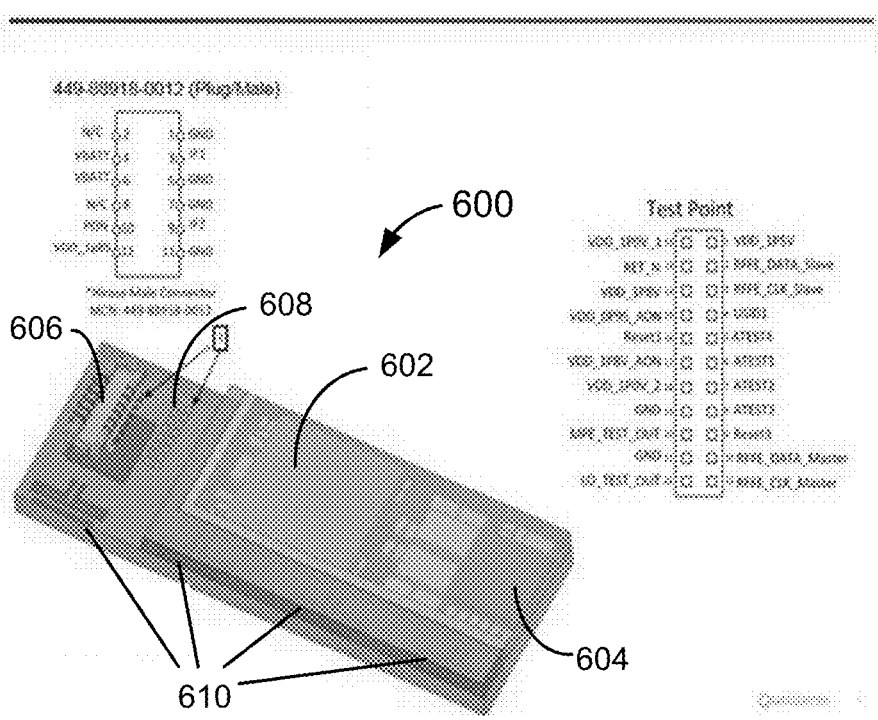
FIG. 6 illustrates a module that can be used as a DUT according to various aspects of the disclosure.

FIG. 6 illustrates a module 600 that can be used as a DUT according to exemplary aspects of the disclosure. The DUT can be a module 600 that includes a transceiver IC 602, a power management IC 604 that regulates and supplies power to the various components on the module, and a connector 606 that can be used to couple to another module and/or to a test fixture. In this configuration, the module 600 also includes test points 608. Further, the module 600 includes a plurality of antennas 610, illustrated as four dipole antennas 610, which may also include associated patch antennas not viewable from the illustrated side of the module 600. It will be appreciated that additional components (e.g., various passive and/or active surface-mount devices (SMDs)) may be provided on the illustrated module 600. Likewise, certain design features are illustrated in FIG. 6 related to the module 600. However, these additional features are merely associated with the specific illustration of the module 600, which is used to represent an example of the DUT components discussed in the foregoing disclosure. Accordingly, the various aspects disclosed herein are not limited to this illustrated example.

Figure 7:
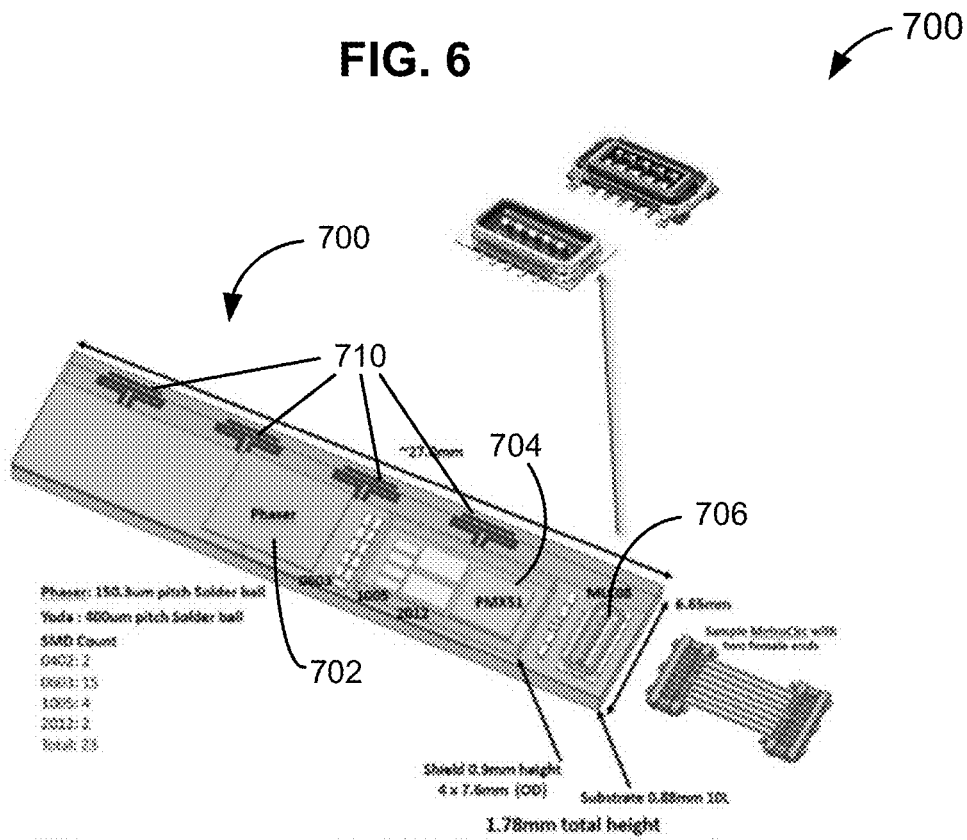
FIG. 7 illustrates another module that can be used as a DUT according to various aspects of the disclosure.

FIG. 7 illustrates another module 700 that can be used as a DUT according to exemplary aspects of the disclosure. The DUT can be a module 700 that includes a transceiver IC 702, a power management IC 704 that regulates and supplies power to the various components on the module, and a connector 706 that can be used to couple to another module and/or to a test fixture. Additionally, the module 700 includes a plurality of antennas 710, illustrated as four dipole antennas 710, which may also include associated patch antennas not viewable from the illustrated side of the module 700. It will be appreciated that additional components (e.g., various passive and/or active SMDs) may be provided on the illustrated module 700. Likewise, certain design features are illustrated in FIG. 7 related to the module 700. However, these additional features are merely associated with the specific illustration of the module 700, which is used to represent an example of the DUT components discussed in the foregoing disclosure. Accordingly, the various aspects disclosed herein are not limited to this illustrated example.

As noted above, the various aspects described herein generally relate to testing of devices or modules that are part of devices that include mmW and/or EHF antennas. These antennas can be used in UEs and other devices used in high data rate communication systems, including 4G and 5G wireless communication systems, and in particular, can be used in wireless communication systems with beam forming and multi-beam transmission and reception. Examples of the UEs and wireless communication systems that utilize these devices are provided in the following paragraphs.

Figure 8:
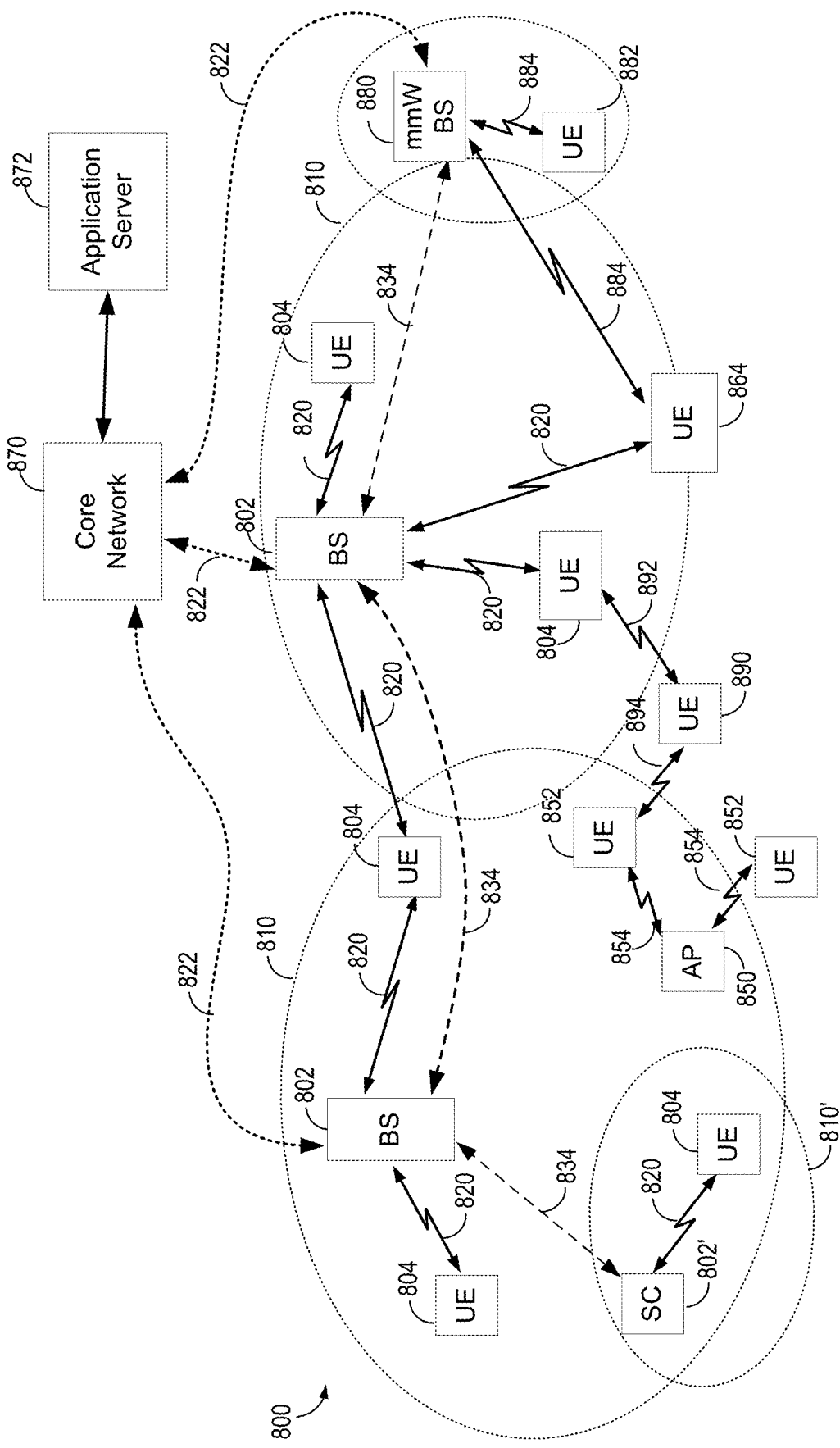
FIG. 8 illustrates an exemplary wireless communications system according to various aspects of the disclosure.

According to various aspects, FIG. 8 illustrates an exemplary wireless communications system 800. The wireless communications system 800 (which may also be referred to as a wireless wide area network (WWAN)) may include various base stations 802 and various UEs 804. The base stations 802 may include macro cell base stations (high power cellular base stations) and/or small cell base stations (low power cellular base stations). In an aspect, the macro cell base station may include evolved NodeBs (eNBs) where the wireless communications system 800 corresponds to an LTE network, or New Radio NodeBs (gNBs) where the wireless communications system 800 corresponds to a NR network, or a combination of both, and the small cell base stations may include femtocells, picocells, microcells, etc.

The base stations 802 may collectively form a radio access network (RAN) and interface with a core network 870 (e.g., an evolved packet core (EPC) or next generation core (NGC)) through backhaul links 822, and through the core network 870 to one or more application servers 872. In addition to other functions, the base stations 802 may perform functions that relate to one or more of transferring user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, RAN sharing, multimedia broadcast multicast service (MBMS), subscriber and equipment trace, RAN information management (RIM), paging, positioning, and delivery of warning messages. The base stations 802 may communicate with each other directly or indirectly (e.g., through the EPC/NGC) over backhaul links 834, which may be wired or wireless.

The base stations 802 may wirelessly communicate with the UEs 804. Each of the base stations 802 may provide communication coverage for a respective geographic coverage area 810. In an aspect, one or more cells may be supported by a base station 802 in each coverage area 810. A "cell" is a logical communication entity used for communication with a base station (e.g., over some frequency resource, referred to as a carrier frequency, component carrier, carrier, band, or the like), and may be associated with an identifier (e.g., a physical cell identifier (PCID), a virtual cell identifier (VCID)) for distinguishing cells operating via the same or a different carrier frequency. In some cases, different cells may be configured according to different protocol types (e.g., machine-type communication (MTC), narrowband IoT (NB-IoT), enhanced mobile broadband (eMBB), or others) that may provide access for different types of UEs. Because a cell is supported by a specific base station, the term "cell" may refer to either or both the logical communication entity and the base station that supports it, depending on the context. In some cases, the term "cell" may also refer to a geographic coverage area of a base station (e.g., a sector), insofar as a carrier frequency can be detected and used for communication within some portion of geographic coverage areas 810.

While neighboring macro cell base station 802 geographic coverage areas 810 may partially overlap (e.g., in a handover region), some of the geographic coverage areas 810 may be substantially overlapped by a larger geographic coverage area 810. For example, a small cell base station 802' may have a coverage area 810' that substantially overlaps with the coverage area 810 of one or more macro cell base stations 802. A network that includes both small cell and macro cell base stations may be known as a heterogeneous network. A heterogeneous network may also include home eNBs (HeNBs), which may provide service to a restricted group known as a closed subscriber group (CSG).

The communication links 820 between the base stations 802 and the UEs 804 may include UL (also referred to as reverse link) transmissions from a UE 804 to a base station 802 and/or downlink (DL) (also referred to as forward link) transmissions from a base station 802 to a UE 804. The communication links 820 may use MIMO antenna technology, including spatial multiplexing, beamforming, and/or transmit diversity. The communication links 820 may be through one or more carrier frequencies. Allocation of carriers may be asymmetric with respect to DL and UL (e.g., more or less carriers may be allocated for DL than for UL).

The wireless communications system 800 may further include a wireless local area network (WLAN) access point (AP) 850 in communication with WLAN stations (STAs) 852 via communication links 854 in an unlicensed frequency spectrum (e.g., 5 GHz). When communicating in an unlicensed frequency spectrum, the WLAN STAs 852 and/or the WLAN AP 850 may perform a clear channel assessment (CCA) or listen before talk (LBT) procedure prior to communicating in order to determine whether the channel is available.

More specifically, LBT is a mechanism by which a transmitter (e.g., a UE on the uplink or a base station on the downlink) applies CCA before using the channel/subband. Thus, before transmission, the transmitter performs a CCA check and listens on the channel/subband for the duration of the CCA observation time, which should not be less than some threshold (e.g., 15 microseconds). The channel may be considered occupied if the energy level in the channel exceeds some threshold (proportional to the transmit power of the transmitter). If the channel is occupied, the transmitter should delay further attempts to access the medium by some random factor (e.g., some number between 1 and 20) times the CCA observation time. If the channel is not occupied, the transmitter can begin transmitting. However, the maximum contiguous transmission time on the channel should be less than some threshold, such as 5 milliseconds.

The small cell base station 802' may operate in a licensed and/or an unlicensed frequency spectrum. When operating in an unlicensed frequency spectrum, the small cell base station 802' may employ LTE or NR technology and use the same 5 GHz unlicensed frequency spectrum as used by the WLAN AP 850. The small cell base station 802', employing LTE/5G in an unlicensed frequency spectrum, may boost coverage to and/or increase capacity of the access network. NR in unlicensed spectrum may be referred to as NR-U. LTE in an unlicensed spectrum may be referred to as LTE-U, licensed assisted access (LAA), or MulteFire.

The wireless communications system 800 may further include a mmW base station 880 that may operate in mmW frequencies and/or near mmW frequencies in communication with a UE 882. Extremely high frequency (EHF) is part of the RF in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band have high path loss and a relatively short range. The mmW base station 880 and the UE 882 may utilize beamforming (transmit and/or receive) over a mmW communication link 884 to compensate for the extremely high path loss and short range. For example, the beamforming can be achieved using antenna arrays including multiple antennas, for example, as described above with reference to the various modules in FIGS. 5A to 7. Further, it will be appreciated that in alternative configurations, one or more base stations 802 may also transmit using mmW or near mmW and beamforming. Accordingly, it will be appreciated that the foregoing illustrations are merely examples and should not be construed to limit the various aspects disclosed herein.

Transmit beamforming is a technique for focusing an RF signal in a specific direction. Traditionally, when a network node (e.g., a base station) broadcasts an RF signal, it broadcasts the signal in all directions (omni-directionally). With transmit beamforming, the network node determines where a given target device (e.g., a UE) is located (relative to the transmitting network node) and projects a stronger downlink RF signal in that specific direction, thereby providing a faster (in terms of data rate) and stronger RF signal for the receiving device(s). To change the directionality of the RF signal when transmitting, a network node can control the phase and relative amplitude of the RF signal at each of the one or more transmitters that are broadcasting the RF signal. For example, a network node may use an array of antennas (referred to as a "phased array" or an "antenna array") that creates a beam of RF waves that can be "steered" to point in different directions, without actually moving the antennas. Specifically, the RF current from the transmitter is fed to the individual antennas with the correct phase relationship so that the radio waves from the separate antennas add together to increase the radiation in a desired direction, while cancelling to suppress radiation in undesired directions.

Transmit beams may be quasi-collocated, meaning that they appear to the receiver (e.g., a UE) as having the same parameters, regardless of whether or not the transmitting antennas of the network node themselves are physically collocated. In NR, there are four types of quasi-collocation (QCL) relations. Specifically, a QCL relation of a given type means that certain parameters about a second reference RF signal on a second beam can be derived from information about a source reference RF signal on a source beam. Thus, if the source reference RF signal is QCL Type A, the receiver can use the source reference RF signal to estimate the Doppler shift, Doppler spread, average delay, and delay spread of a second reference RF signal transmitted on the same channel. If the source reference RF signal is QCL Type B, the receiver can use the source reference RF signal to estimate the Doppler shift and Doppler spread of a second reference RF signal transmitted on the same channel. If the source reference RF signal is QCL Type C, the receiver can use the source reference RF signal to estimate the Doppler shift and average delay of a second reference RF signal transmitted on the same channel. If the source reference RF signal is QCL Type D, the receiver can use the source reference RF signal to estimate the spatial receive parameter of a second reference RF signal transmitted on the same channel.

In receive beamforming, the receiver uses a receive beam to amplify RF signals detected on a given channel. For example, the receiver can increase the gain setting and/or adjust the phase setting of an array of antennas in a particular direction to amplify (e.g., to increase the gain level of) the RF signals received from that direction. Thus, when a receiver is said to beamform in a certain direction, it means the beam gain in that direction is high relative to the beam gain along other directions, or the beam gain in that direction is the highest compared to the beam gain in that direction of all other receive beams available to the receiver. This results in a stronger received signal strength (e.g., reference signal received power (RSRP), reference signal received quality (RSRQ), signal-to-interference-plus-noise ratio (SINR), etc.) of the RF signals received from that direction.

Receive beams may be spatially related. A spatial relation means that parameters for a transmit beam for a second reference signal can be derived from information about a receive beam for a first reference signal. For example, a UE may use a particular receive beam to receive a reference downlink reference signal (e.g., synchronization signal block (SSB)) from a base station. The UE can then form a transmit beam for sending an uplink reference signal (e.g., sounding reference signal (SRS)) to that base station based on the parameters of the receive beam.

Note that a "downlink" beam may be either a transmit beam or a receive beam, depending on the entity forming it. For example, if a base station is forming the downlink beam to transmit a reference signal to a UE, the downlink beam is a transmit beam. If the UE is forming the downlink beam, however, it is a receive beam to receive the downlink reference signal. Similarly, an "uplink" beam may be either a transmit beam or a receive beam, depending on the entity forming it. For example, if a base station is forming the uplink beam, it is an uplink receive beam, and if a UE is forming the uplink beam, it is an uplink transmit beam.

In NR, the frequency spectrum in which wireless nodes (e.g., base stations 802/880, UEs 804/882) operate is divided into multiple frequency ranges, FR1 (from 450 to 6000 MHz), FR2 (from 24250 to 52600 MHz), FR3 (above 52600 MHz), and FR4 (between FR1 and FR2). In a multi-carrier system, such as NR, one of the carrier frequencies is referred to as the "primary carrier" or "anchor carrier" or "primary serving cell" or "PCell," and the remaining carrier frequencies are referred to as "secondary carriers" or "secondary serving cells" or "SCells." In carrier aggregation, the anchor carrier is the carrier operating on the primary frequency (e.g., FR1) utilized by a UE 804/882 and the cell in which the UE 804/882 either performs the initial radio resource control (RRC) connection establishment procedure or initiates the RRC connection re-establishment procedure. The primary carrier carries all common and UE-specific control channels, and may be a carrier in a licensed frequency (however, this is not always the case). A secondary carrier is a carrier operating on a second frequency (e.g., FR2) that may be configured once the RRC connection is established between the UE 804 and the anchor carrier and that may be used to provide additional radio resources. In some cases, the secondary carrier may be a carrier in an unlicensed frequency. The secondary carrier may contain only necessary signaling information and signals, for example, those that are UE-specific may not be present in the secondary carrier, since both primary uplink and downlink carriers are typically UE-specific. This means that different UEs 804/882 in a cell may have different downlink primary carriers. The same is true for the uplink primary carriers. The network is able to change the primary carrier of any UE 804/882 at any time. This is done, for example, to balance the load on different carriers. Because a "serving cell" (whether a PCell or an SCell) corresponds to a carrier frequency/component carrier over which some base station is communicating, the term "cell," "serving cell," "component carrier," "carrier frequency," and the like can be used interchangeably.

For example, still referring to FIG. 8, one of the frequencies utilized by the macro cell base stations 802 may be an anchor carrier (or "PCell") and other frequencies utilized by the macro cell base stations 802 and/or the mmW base station 880 may be secondary carriers ("SCells"). The simultaneous transmission and/or reception of multiple carriers enables the UE 804/882 to significantly increase its data transmission and/or reception rates. For example, two 20 MHz aggregated carriers in a multi-carrier system would theoretically lead to a two-fold increase in data rate (i.e., 40 MHz), compared to that attained by a single 20 MHz carrier.

The wireless communications system 800 may further include one or more UEs, such as UE 890, that connects indirectly to one or more communication networks via one or more device-to-device (D2D) peer-to-peer (P2P) links. In the example of FIG. 8, UE 890 has a D2D P2P link 892 with one of the UEs 804 connected to one of the base stations 802 (e.g., through which UE 890 may indirectly obtain cellular connectivity) and a D2D P2P link 894 with WLAN STA 852 connected to the WLAN AP 850 (through which UE 890 may indirectly obtain WLAN-based Internet connectivity). In an example, the D2D P2P links 892 and 894 may be supported with any well-known D2D RAT, such as LTE Direct (LTE-D), WiFi Direct (WiFi-D), Bluetooth®, and so on.

It will be appreciated that the various UEs described herein can include antenna arrays including multiple antennas, for example, as described above with reference to the various modules in FIGS. 5A to 7.

Figure 9:
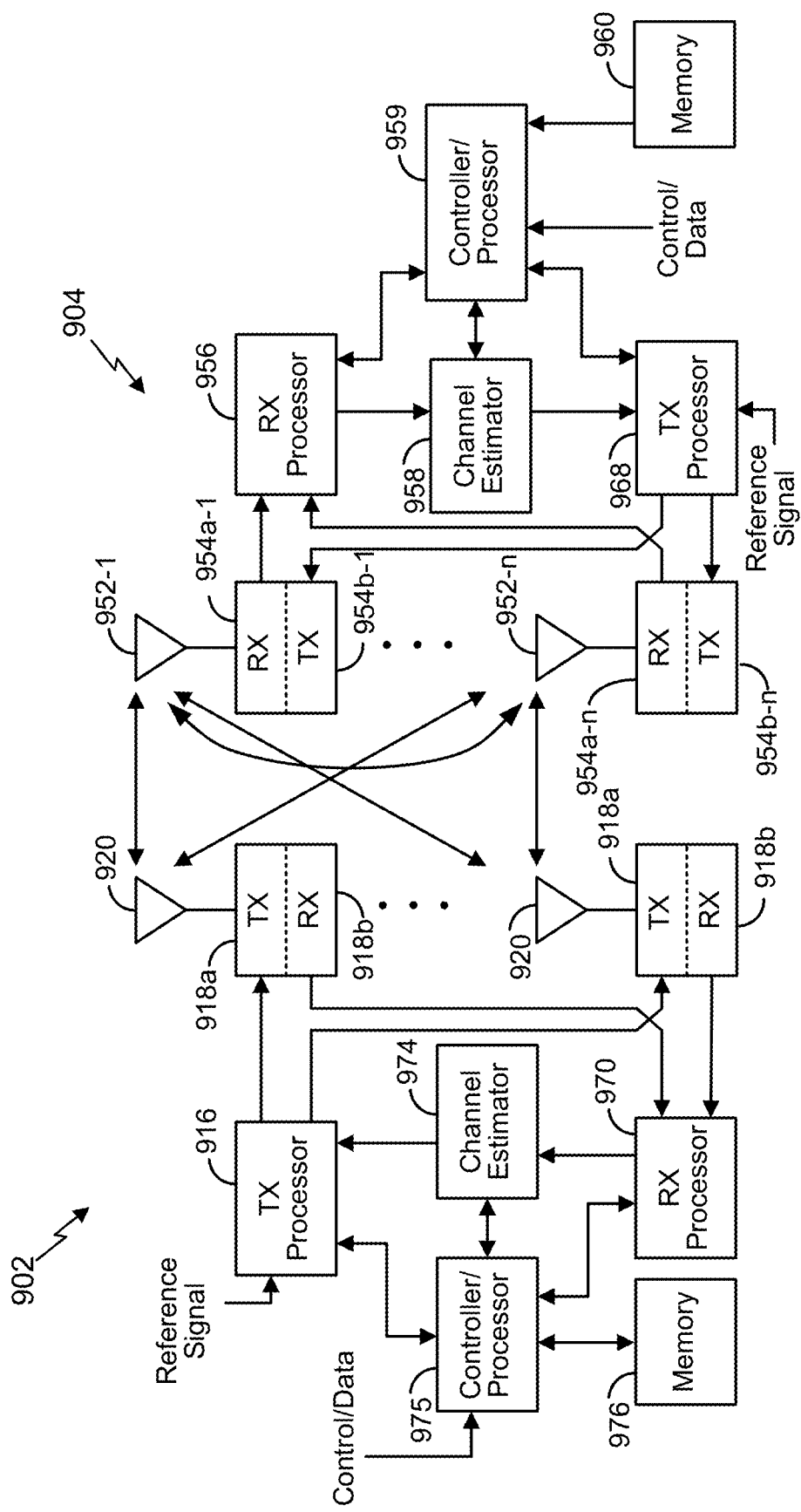
FIG. 9 illustrates an exemplary base station and exemplary UE in an access network according to various aspects of the disclosure.

FIG. 9 illustrates an exemplary base station 902 (e.g., an eNB, a gNB, a small cell AP, a WLAN AP, etc.) in communication with an exemplary UE 904 in a wireless network, according to aspects of the disclosure. The base station 902 may correspond to any of the base stations described above with reference to FIG. 8, and the UE 904 may correspond to any of the UEs described above with reference to FIG. 8. The UE 904 may be, or may include, a DUT, as described herein.

In the DL, IP packets from the core network may be provided to a controller/processor 975. The controller/processor 975 implements functionality for a radio resource control (RRC) layer, a packet data convergence protocol (PDCP) layer, a radio link control (RLC) layer, and a medium access control (MAC) layer. The controller/processor 975 provides RRC layer functionality associated with broadcasting of system information (e.g., MIB, SIBs), RRC connection control (e.g., RRC connection paging, RRC connection establishment, RRC connection modification, and RRC connection release), inter-RAT mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through automatic repeat request (ARQ), concatenation, segmentation, and reassembly of RLC service data units (SDUs), re-segmentation of RLC data PDUs, and reordering of RLC data PDUs; and MAC layer functionality associated with mapping between logical channels and transport channels, scheduling information reporting, error correction, priority handling, and logical channel prioritization.

The transmit (TX) processor 916 and the receive (RX) processor 970 implement Layer-1 functionality associated with various signal processing functions. Layer-1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 916 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an orthogonal frequency division multiplexing (OFDM) subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 974 may be used to determine the coding and modulation scheme, as well as for spatial processing. The channel estimate may be derived from a reference signal and/or channel condition feedback transmitted by the UE 904. Each spatial stream may then be provided to one or more different antennas 920 via a separate transmitter 918a. Each transmitter 918a may modulate an RF carrier with a respective spatial stream for transmission. It will be appreciated that the antennas 920 may be an antenna array including multiple antennas, for example, as described above with reference to the various modules in FIGS. 5A to 7.

At the UE 904, each receiver 954a receives a signal through its respective antenna 952 (for example, receiver 954a-1 receives the signal through antenna 952-1, etc.). It will be appreciated that the antennas 952 may be an antenna array including multiple antennas (illustrated as antennas 952-1 to 952-n), for example, as described above with reference to the various modules in FIGS. 5A to 7. Each receiver 954a recovers information modulated onto an RF carrier and provides the information to the RX processor 956. The TX processor 968 and the RX processor 956 implement Layer-1 functionality associated with various signal processing functions. The RX processor 956 may perform spatial processing on the information to recover any spatial streams destined for the UE 904. If multiple spatial streams are destined for the UE 904, they may be combined by the RX processor 956 into a single OFDM symbol stream. The RX processor 956 then converts the OFDM symbol stream from the time-domain to the frequency domain using a fast Fourier transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 902. These soft decisions may be based on channel estimates computed by the channel estimator 958. The soft decisions are then decoded and de-interleaved to recover the data and control signals that were originally transmitted by the base station 902 on the physical channel. The data and control signals are then provided to the controller/processor 959, which implements Layer-3 and Layer-2 functionality.

The controller/processor 959 can be associated with a memory 960 that stores program codes and data. The memory 960 may be referred to as a computer-readable medium. In the UL, the controller/processor 959 provides demultiplexing between transport and logical channels, packet reassembly, deciphering, header decompression, and control signal processing to recover IP packets from the core network. The controller/processor 959 is also responsible for error detection.

In an aspect, the controller/processor 959 may be configured to set the UE 904 in a simultaneous transmit and receive mode; receive, from a test unit (for example, via "control/data" input to the UE 904 through a connector, etc., a lower frequency RF signal; up-convert, via an up-converter, the lower frequency RF signal to a higher frequency RF signal; transmit, via a first antenna 952, the higher frequency RF signal; receive, via a second antenna 952, the higher frequency RF signal; down-convert, via a down-converter, the received higher frequency RF signal to a received test RF signal; and provide, via one or more transmitters 954b and antennas 952, the received test RF signal to the test unit. Alternatively, any combination of controller/processor 959, RX processor 956, and TX processor 968 may be configured to perform these operations. In an aspect, the up-converter may be implemented in the transmit processor 968, the respective transmitter 954b, or any combination thereof, and the down-converter may be implemented in the receive processor 956, the respective receiver 954, or any combination thereof.

Similar to the functionality described in connection with the DL transmission by the base station 902, the controller/processor 959 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by the channel estimator 958 from a reference signal or feedback transmitted by the base station 902 may be used by the TX processor 968 to select the appropriate coding and modulation schemes, and to facilitate spatial processing. The spatial streams generated by the TX processor 968 may be provided to different antenna 952 via separate transmitters 954b. Each transmitter 954b may modulate an RF carrier with a respective spatial stream for transmission. In an aspect, the transmitters 954b and the receivers 954a may be one or more transceivers, one or more discrete transmitters, one or more discrete receivers, or any combination thereof.

In an aspect, each transmitter 954b (illustrated as transmitters 954b-1 to 954b-n) may comprise a separate transmit chain (e.g., phase shifter, mixer, power amplifier, antenna 952, etc.), and each receiver 954a (illustrated as transmitter 954a-1 to 954a-n) may comprise a separate receive chain (e.g., phase shifter, mixer, low noise amplifier (LNA), antenna 952, etc.). As such, it is understood that for a given antenna combination, it is possible for the transmit path of a transmit antenna to be electrically independent of a receive path of a receive antenna. Isolating the transmit path (including transmitter 954b) of a first antenna from the receive path (including receiver 954) of a second antenna can enable simultaneous or near simultaneous transmission and reception of test signals as described herein. In an aspect, groups of one or more receivers 954a/transmitters 954b and corresponding antennas 952 may correspond to a different layer. The term "layer" is synonymous with "stream." For MIMO operation, at least two layers must be used. In some cases, up to four layers may be allowed. The number of layers is always less than or equal to the number of antennas 952. The UE 904, when being tested as described herein, needs to be able to operate on at least two layers to simultaneously transmit and receive, as described herein.

The UL transmission from the UE 904 is processed at the base station 902 in a manner similar to that described in connection with the receiver function at the UE 904. Each receiver 918b receives a signal through its respective antenna 920. Each receiver 918b recovers information modulated onto an RF carrier and provides the information to a RX processor 970. In an aspect, the transmitters 918a and the receivers 918b may be one or more transceivers, one or more discrete transmitters, one or more discrete receivers, or any combination thereof.

The controller/processor 975 can be associated with a memory 976 that stores program codes and data. The memory 976 may be referred to as a computer-readable medium. In the UL, the controller/processor 975 provides demultiplexing between transport and logical channels, packet reassembly, deciphering, header decompression, control signal processing to recover IP packets from the UE 904. IP packets from the controller/processor 975 may be provided to the core network. The controller/processor 975 is also responsible for error detection.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the various aspects described herein.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations).

The methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of non-transitory computer-readable medium known in the art. An exemplary non-transitory computer-readable medium may be coupled to the processor such that the processor can read information from, and write information to, the non-transitory computer-readable medium. In the alternative, the non-transitory computer-readable medium may be integral to the processor. The processor and the non-transitory computer-readable medium may reside in an ASIC. The ASIC may reside in a user device (e.g., a UE) or a base station. In the alternative, the processor and the non-transitory computer-readable medium may be discrete components in a user device or base station.

In one or more exemplary aspects, the functions described herein may be implemented in hardware, software, firmware, or any combination thereof. If implemented in software, the functions may be stored on or transmitted over as one or more instructions or code on a non-transitory computer-readable medium. Computer-readable media may include storage media and/or communication media including any non-transitory medium that may facilitate transferring a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of a medium. The term disk and disc, which may be used interchangeably herein, includes compact disk (CD), laser disc, optical disc, digital video disk (DVD), floppy disk, and Blu-ray discs, which usually reproduce data magnetically and/or optically with lasers. Combinations of the above should also be included within the scope of computer-readable media.

For example, one aspects of the disclosure can include a non-transitory computer-readable medium including code, which, when executed by a processor, causes the processor to perform operations for self-radiated loopback testing of a DUT.

While the foregoing disclosure shows illustrative aspects, those skilled in the art will appreciate that various changes and modifications could be made herein without departing from the scope of the disclosure as defined by the appended claims. Furthermore, in accordance with the various illustrative aspects described herein, those skilled in the art will appreciate that the functions, steps, and/or actions in any methods described above and/or recited in any method claims appended hereto need not be performed in any particular order. Further still, to the extent that any elements are described above or recited in the appended claims in a singular form, those skilled in the art will appreciate that singular form(s) contemplate the plural as well unless limitation to the singular form(s) is explicitly stated.

What is claimed is:

1. A method of testing a device under test (DUT) performed by the DUT, the method comprising:
    setting the DUT in a simultaneous transmit and receive mode;
    receiving a lower frequency radio frequency (RF) signal from a test unit, the lower frequency RF signal being a signal in a GHz frequency range;
    up-converting the lower frequency RF signal to a higher frequency RF signal, the higher frequency RF signal having a higher frequency than the lower frequency RF signal;
    transmitting the higher frequency RF signal using a first antenna of the DUT on a first multiple-input and multiple-output (MIMO) layer;
    receiving the higher frequency RF signal using a second antenna of the DUT on a second MIMO layer;
    down-converting the received higher frequency RF signal to a received test RF signal; and
    providing the received test RF signal to the test unit.

2. The method of claim 1, wherein the first antenna and the second antenna are selected from a plurality of antennas of the DUT.

3. The method of claim 2, wherein the plurality of antennas are coupled to the DUT prior to testing.

4. The method of claim 2, wherein the first antenna and the second antenna are separated by at least one other antenna of the plurality of antennas.

5. The method of claim 2, wherein the plurality of antennas includes one or more dipole antennas and one or more patch antennas.

6. The method of claim 5, wherein the first antenna and the second antenna are both dipole antennas.

7. The method of claim 5, wherein the first antenna and the second antenna are both patch antennas.

8. The method of claim 1, wherein the transmitting and receiving are performed by a single transceiver integrated circuit (IC) that is part of the DUT.

9. The method of claim 1, further comprising:
    receiving a second lower frequency RF signal from the test unit, the second lower frequency RF signal being a signal in the GHz frequency range;
    up-converting the second lower frequency RF signal to a second higher frequency RF signal, the second higher frequency RF signal having a higher frequency than the second lower frequency RF signal;
    transmitting the second higher frequency RF signal using the second antenna;
    receiving the second higher frequency RF signal using the first antenna;
    down-converting the received second higher frequency RF signal to a second received test RF signal; and
    providing the second received test RF signal to the test unit.

10. The method of claim 9, wherein the lower frequency RF signal and the second lower frequency RF signal are the same.

11. The method of claim 1, wherein the lower frequency RF signal received from the test unit comprises a multi-tone RF signal.

12. The method of claim 1, wherein the lower frequency RF signal comprises a non-millimeter wave RF signal in the GHz frequency range and the higher frequency RF signal comprises a millimeter wave RF signal.

13. A device under test (DUT), comprising:
    a memory;
    a plurality of antennas coupled to the at least one processor, the plurality of antenna comprising at least a first antenna and a second antenna, wherein a transmit path for the first antenna is electrically independent of a receive path of the second antenna;
    an up-converter and a down-converter; and
    at least one processor coupled to the memory, the at least one processor configured to:
        set the DUT in a simultaneous transmit and receive mode;
        receive a lower frequency radio frequency (RF) signal from a test unit, the lower frequency RF signal being a signal in a GHz frequency range;
        up-convert, via the up-converter, the lower frequency RF signal to a higher frequency RF signal, the higher frequency RF signal having a higher frequency than the lower frequency RF signal;
        transmit, via the first antenna, the higher frequency RF signal on a first multiple-input and multiple-output (MIMO) layer;
        receive, via the second antenna, the higher frequency RF signal on a second MIMO layer;
        down-convert, via the down-converter, the received higher frequency RF signal to a received test RF signal; and
        provide the received test RF signal to the test unit.

14. The DUT of claim 13, wherein the first antenna and the second antenna are separated by at least one other antenna of the plurality of antennas.

15. The DUT of claim 13, wherein the plurality of antennas includes one or more dipole antennas and one or more patch antennas.

16. The DUT of claim 15, wherein the first antenna and the second antenna are both dipole antennas, or wherein the first antenna and the second antenna are both patch antennas.

17. The DUT of claim 13, wherein the lower frequency RF signal comprises a non-millimeter wave RF signal in the GHz frequency range and the higher frequency RF signal comprises a millimeter wave RF signal.

18. The DUT of claim 13, wherein the first antenna and the second antenna are separated by at least one other antenna of the plurality of antennas.

19. The DUT of claim 13, wherein the plurality of antennas includes one or more dipole antennas and one or more patch antennas.

20. The DUT of claim 19, wherein the first antenna and the second antenna are both dipole antennas, or wherein the first antenna and the second antenna are both patch antennas.

* * * * *